US010553257B2

(12) United States Patent
Dayley et al.

(10) Patent No.: US 10,553,257 B2
(45) Date of Patent: *Feb. 4, 2020

(54) LOW-POWER, HIGH-ACCURACY CURRENT REFERENCE FOR HIGHLY DISTRIBUTED CURRENT REFERENCES FOR CROSS POINT MEMORY

(71) Applicant: Intel Corporation, Santa Clara, CA (US)

(72) Inventors: Matthew G. Dayley, Plymouth, CA (US); Yadhu Vamshi S. Vancha, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/001,396

(22) Filed: Jun. 6, 2018

(65) Prior Publication Data

US 2018/0350409 A1    Dec. 6, 2018

Related U.S. Application Data

(63) Continuation of application No. 15/005,194, filed on Jan. 25, 2016, now Pat. No. 9,997,207, which is a
(Continued)

(51) Int. Cl.
*G11C 5/14* (2006.01)
*G05F 3/08* (2006.01)
(Continued)

(52) U.S. Cl.
CPC ............. *G11C 5/147* (2013.01); *G05F 3/08* (2013.01); *G05F 3/26* (2013.01); *G11C 7/10* (2013.01);
(Continued)

(58) Field of Classification Search
CPC ...................................................... G11C 5/147
See application file for complete search history.

(56) References Cited

U.S. PATENT DOCUMENTS

| 7,023,753 | B2 | 4/2006 | Theel |
| 7,227,804 | B1 | 6/2007 | Kothandaraman et al. |

(Continued)

FOREIGN PATENT DOCUMENTS

| JP | 2010152894 A | 7/2010 |
| KR | 20100070535 A | 6/2010 |
| WO | 2014158414 A1 | 10/2014 |

OTHER PUBLICATIONS

Chinese and English translation of Notice of Allowance for Chinese Patent Application No. 201480011139.4, dated Jan. 23, 2018, 6 pages.
(Continued)

*Primary Examiner* — Hai L Nguyen
(74) *Attorney, Agent, or Firm* — Compass IP Law PC

(57) ABSTRACT

A highly distributed current reference for a solid-state memory comprises a centrally located current digital-to-analog converter (IDAC) and a plurality of remotely located tile current references. The IDAC comprises a first active device that generates a reference current, and a device that forms a first source degeneration resistance for the first active device. The IDAC outputs a voltage signal that represents a magnitude of the reference current. A remotely located tile current reference comprises a second active device and a device that forms a second source degeneration resistance for the second active device. The source degeneration resistances and capacitance coupled to the voltage signal output from the IDAC compensate for current, temperature, supply and process variations.

26 Claims, 4 Drawing Sheets

Related U.S. Application Data continuation of application No. 13/853,813, filed on Mar. 29, 2013, now Pat. No. 9,280,168.

(51) Int. Cl.

| | | |
|---|---|---|
| *G11C 7/14* | (2006.01) | |
| *G11C 27/02* | (2006.01) | |
| *G05F 3/26* | (2006.01) | |
| *G11C 7/10* | (2006.01) | |

(52) U.S. Cl.
CPC ............... *G11C 7/14* (2013.01); *G11C 27/02* (2013.01); *G11C 27/024* (2013.01)

(56) References Cited

U.S. PATENT DOCUMENTS

| | | | |
|---|---|---|---|
| 8,456,227 | B2 | 6/2013 | Hirashiki et al. |
| 9,019,005 | B2 | 4/2015 | Feldtkeller |
| 9,280,168 | B2 * | 3/2016 | Dayley .............. G05F 3/08 |
| 9,577,613 | B2 | 2/2017 | Yang et al. |
| 9,997,207 | B2 * | 6/2018 | Dayley .............. G05F 3/08 |
| 2005/0117408 | A1 | 6/2005 | Theel |
| 2006/0066360 | A1 | 3/2006 | Liu |
| 2009/0085654 | A1 | 4/2009 | Lin |
| 2010/0148855 | A1 | 6/2010 | Yu et al. |
| 2011/0188283 | A1 | 8/2011 | Chevallier et al. |
| 2011/0215837 | A1 | 9/2011 | Li et al. |
| 2013/0002228 | A1 | 1/2013 | Wong et al. |

OTHER PUBLICATIONS

English Translation of Chinese Office Action, Patent Application No. 201480011139.4, dated Apr. 17, 2017, 2 pages.
English Translation of State Intellectual Property Office, P.R. China, Second Office Action, Patent Application No. 201480011139.4, dated Oct. 23, 2017, 4 pages.
English Translation of State Intellectual Property Office, P.R. Chinese Search Report, Patent Application No. 201480011139.4, dated Feb. 21, 2017, 2 pages.
English Translation of the Notice of Preliminary Rejection, Application No. 10-2016-7036897, dated Apr. 6, 2017, 5 pages.
European Office Action for Patent Application No. 14774639, dated Apr. 17, 2018, 6 pages.
Extended European Search Report for Patent Application No. 14774639.0, dated Feb. 14, 2017, 10 pages.
International Preliminary Report on Patentability received for International Application No. PCT/US2014/016288, dated Oct. 8, 2015, 6 pages. cited by applicant.
International Search Report and Written Opinion received for PCT Patent Application No. PCT/US2014/016288, dated May 27, 2014, 9 pages. cited by applicant.
Notice of Allowance for U.S. Appl. No. 13/853,813, dated Jun. 25, 2015, 8 pages.
Notice of Allowance for U.S. Appl. No. 13/853,813, dated Nov. 6, 2015, 9 pages.
Notice of Allowance received for Korean Patent Application No. 10-2015-7022388, dated Sep. 28, 2016, 2 pages of Notice of Allowance and 7 pages of English translation of allowed claims.
Office Action for U.S. Appl. No. 15/005,194, dated Oct. 13, 2017, 9 pages.
Office Action received for Japanese Patent Application No. 201480011139.4, dated Oct. 25, 2017, 4 pages including 1 pages of English translation.
Office Action received for Japanese Patent Application No. 2016-505462, dated Dec. 6, 2016, 4 pages including 2 pages of English translation.
Office Action received for Korean Patent Application No. 10-2015-70022388, dated Apr. 12, 2016, 4 pages including 1 page of English translation.
Extended European Search Report for Patent Application No. 19188039.2, dated Oct. 15, 2019, 11 pages.

* cited by examiner

LOW-POWER, HIGH-ACCURACY CURRENT REFERENCE FOR HIGHLY DISTRIBUTED CURRENT REFERENCES FOR CROSS POINT MEMORY

CROSS-REFERENCE TO RELATED APPLICATION

This application is a continuation under 35 U.S.C. § 120 of U.S. patent application Ser. No. 13/853,813, filed on Mar. 29, 2013, now U.S. Pat. No. 9,280,168, which is a continuation of U.S. patent application Ser. No. 15/005,194, filed on Jan. 25, 2016, now U.S. Pat. No. 9,997,207 the entire contents of which are incorporated herein by reference.

TECHNICAL FIELD

The subject matter disclosed herein relates to cross-point memories. More particularly, the subject matter disclosed herein relates to a low-power, high-accuracy current reference for highly distributed current reference for a solid-state memory, such as a cross-point memory.

BACKGROUND

A three-dimensional (3D) cross-point memory is a solid-state, non-volatile type of memory that for some memory operations requires delivery of accurate currents at many locations around a cross-point memory chip. For example, in one exemplary embodiment of a cross-point memory chip, over 8000 locations on the chip require an accurate low-power current reference that can instantaneously deliver a reference current for a memory operation. Transferring a reference current from a central location to each of a plurality of current mirrors that are highly distributed across a chip has serious drawbacks in both power and chip-area use considerations. Another approach that has been used is to transfer a bias voltage that is remotely converted into a reference current at a plurality of locations. Such an approach presents challenges because each separate current reference source must be calibrated to remove mismatches, such as random device offsets that can appear around a chip that are caused by process offsets. Additionally, the remotely generated reference current is sensitive to bias voltage noise, temperature variations, and supply voltage variations.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
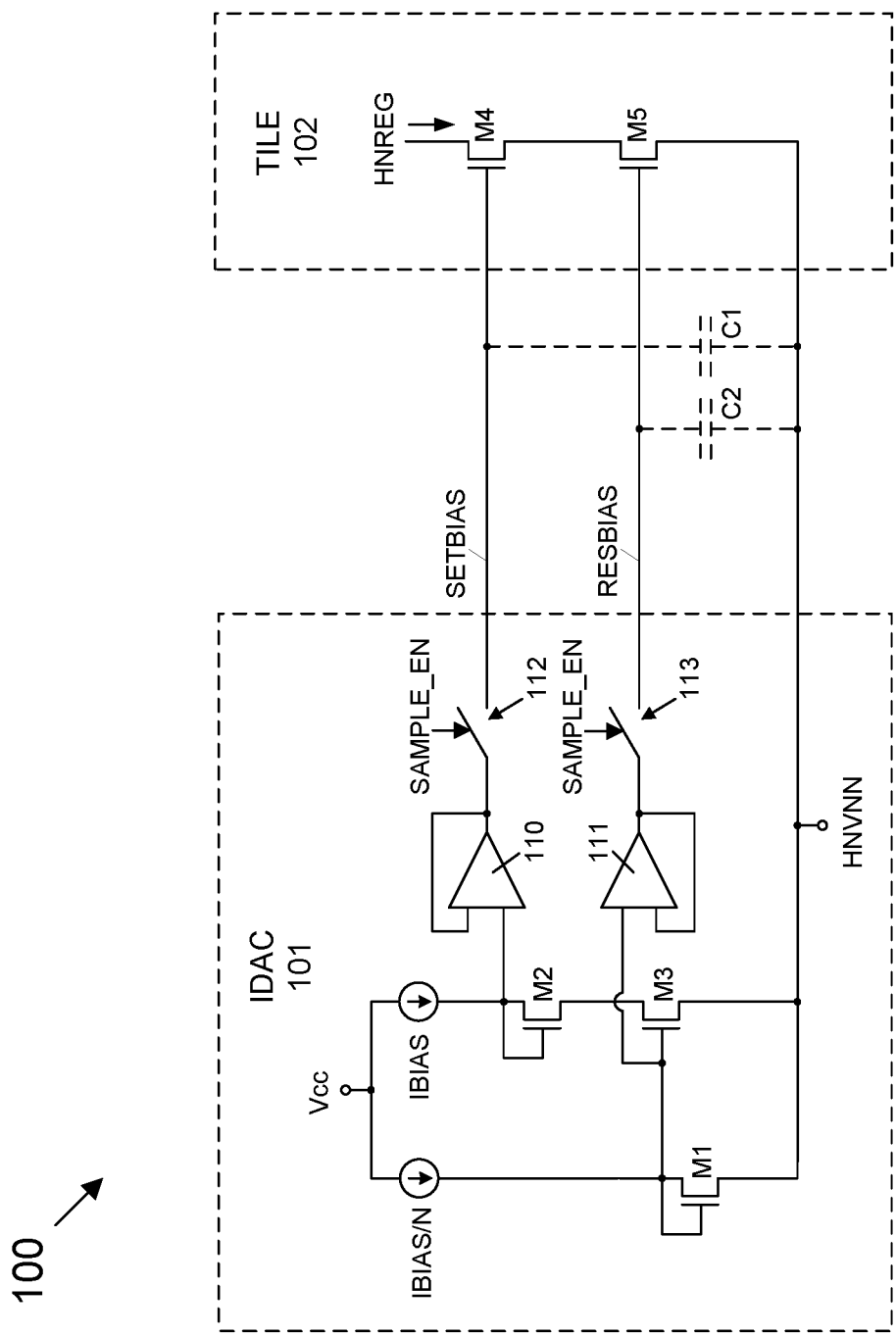
FIG. 1 depicts a schematic diagram of an exemplary embodiment of a highly distributed current reference 100 according to the subject matter disclosed herein.

It will be appreciated that for simplicity and/or clarity of illustration, elements depicted in the figures have not necessarily been drawn to scale. For example, the dimensions of some of the elements may be exaggerated relative to other elements for clarity. The scaling of the figures does not represent precise dimensions and/or dimensional ratios of the various elements depicted herein. Further, if considered appropriate, reference numerals have been repeated among the figures to indicate corresponding and/or analogous elements.

DESCRIPTION OF THE EMBODIMENTS

The subject matter disclosed herein relates to cross-point memories. More particularly, the subject matter disclosed herein relates to a low-power, high-accuracy current reference for highly distributed current reference for a cross-point memory. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. Additionally, the word "exemplary" is used herein to mean "serving as an example, instance, or illustration." Any embodiment described herein as "exemplary" is not to be construed as necessarily preferred or advantageous over other embodiments.

Various operations may be described as multiple discrete operations in turn and in a manner that is most helpful in understanding the claimed subject matter. The order of description, however, should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The subject matter disclosed herein provides a low-power, high-accuracy current reference system that can be used for highly distributed current references of a solid-state memory, such as, but not limited to, a cross-point memory. In one exemplary embodiment, the low-power, high-accuracy current reference system disclosed herein comprises part of a solid-state drive. Embodiments of the subject matter disclosed herein utilize a source degeneration technique to compensate for current, temperature, supply and process variations. That is, embodiment of the subject matter disclosed herein use an active Metal-Oxide Semiconductor (MOS) device as a source degeneration resistance with active biasing that significantly reduces adverse influences of bias voltage noise, supply voltage variations and device offsets. Additionally, embodiments of the subject matter disclosed herein provide a particularly low-power current reference system that is instantly available even during an exit from a standby mode by remaining in a sample-and-hold mode for long periods of time. Moreover, embodiments of the subject matter disclosed herein use a relatively small area in comparison to conventional techniques. Although the subject matter disclosed herein is described in relationship to a cross-point memory, a solid-state memory and/or a solid-state drive, it should be understood that the subject matter disclosed herein is not so limited and is applicable in a system that utilizes highly distributed current references, such as, but not limited to, imaging systems and other sensor systems.

FIG. 1 depicts a schematic diagram of a first exemplary embodiment of a highly distributed current reference 100 according to the subject matter disclosed herein. Highly distributed current reference 100 comprises a centrally located current digital-to-analog converter (IDAC) 101 and a plurality of remotely located TILE current references 102, of which only one remotely located TILE current reference 102 is shown. IDAC 101 comprises a first current source IBIAS/N, a second current source IBIAS, three Complementary Metal Oxide Semiconductor (CMOS) active devices M1-M3, a first buffer amplifier 110, a second buffer amplifier 111, and first and second switches 112 and 113. One terminal of current source IBIAS/N is coupled to a power supply voltage Vcc and the other terminal of current source IBIAS/N is coupled to the drain and the gate of active device M1. The source of active device M1 is coupled to a supply voltage HNVNN. One terminal of current source IBIAS is coupled to power supply voltage Vcc and the other terminal of current source IBIAS is coupled to the drain and the gate of active device M2. The source of active device M2 is coupled to the drain of active device M3. The gate of active device M3 is coupled to the drain and gate of active device M1. The source of active device M3 is coupled to supply voltage HNVNN.

The drain of active device M2 is coupled to the input to buffer amplifier 110, and the gate of active device M3 is coupled to the input of buffer amplifier 111. The output of buffer amplifier 110 is coupled to the input of switch 112, and the output of buffer amplifier 111 is coupled to the input of switch 113. The output of switch 112 is coupled to a signal line SETBIAS. The output of switch 113 is coupled to signal line RESBIAS. The voltages appearing on the SETBIAS and RESBIAS signal lines are respectively based on a magnitude of the current through current source IBIAS and a magnitude of the current through current source IBIAS/N. Buffer amplifiers 110 and 111 have sufficient drive capability to charge capacitances C1 and C2, which respectively represent the coupling capacitance between signal line SETBIAS and supply voltage HNVNN and between signal line RESBIAS and supply voltage HNVNN.

Switches 112 and 113 are each controlled to sample and hold the respective outputs of buffer amplifiers 110 and 111 by a SAMPLE_EN signal. In one exemplary embodiment, the circuitry of IDAC 101 is capable of being turned off (i.e., placed in a standby mode), and when the voltages on signal lines SETBIAS and RESBIAS are to be refreshed, the circuitry of IDAC 101 is powered up and allowed to stabilize to refresh the voltages on signal lines SETBIAS and RESBIAS. SAMPLE_EN is then controlled to be "true" so that switches 112 and 113 are actuated and signal lines SETBIAS and RESBIAS are refreshed. SAMPLE_EN is then controlled to be "not true," thereby opening switches 112 and 113. The circuitry of IDAC 101 is then controlled to be turned off (i.e., the standby mode) so that the highly distributed current reference does not dissipate power during the time that signal lines SETBIAS and RESBIAS are not being refreshed.

Signals lines SETBIAS and RESBIAS are distributed around the integrated circuit to a plurality of TILE current references 102, of which only one is shown in FIG. 1. In one exemplary embodiment, signal lines SETBIAS and RESBIAS are coupled to more than 8000 TILE current references 102. In one exemplary embodiment, each TILE current reference 102 comprises CMOS active devices M4 and M5. The drain of active device M4 is coupled to a supply voltage HNREG, and the source of active device M4 is coupled to the drain of active device M5. The source of active device M5 is coupled to supply voltage HNVNN. The gate of active device M4 is coupled to signal line SETBIAS, and the gate of active device M5 is coupled to signal line RESBIAS.

The current variation through the current mirror at the HNREG node with respect to the current at IDAC 101 is minimized because active devices M3 and M5 operate in a linear region and are respectively used as a degenerative resistance for the current mirrors (active devices M2 and M4). The resistive values of active devices M3 and M5 are equal or about equal. In one exemplary embodiment, node HNREG comprises a node through which current passing through active device M4 is controlled by IDAC 101. The voltage drop across the degeneration resistance (e.g., about 500 mV) mitigates the current variation due to $V_t$ mismatch or supply variation (HNVNN) by linearizing the relationship between the current and the gate voltage of bias device M4. The gate voltage of the degeneration resistance generated at the center of the chip tracks, that is follows, variable DAC currents and also process, voltage, temperature (PVT) variations, thereby maintaining a relatively constant voltage drop across the degeneration device.

The SETBIAS and RESBIAS signal lines track sudden HNVNN voltage variations based on the capacitance between them (i.e., capacitors C1 and C2). In one exemplary embodiment, signal lines SETBIAS and RESBIAS and power supply HNVNN are physically arranged to remain in close proximity to each other as they are distributed around an integrated circuit. That is, the capacitance C1 between the SETBIAS line and power supply HNVNN and the capacitance C2 between the RESBIAS line and power supply HNVNN reduce inaccuracies caused by power supply variations coupling through active devices M4 and M5, and holds the bias for long periods of time (allowing for a sample-to-hold ratio in excess of 1:1000), thereby significantly reducing power consumption. Because SETBIAS and RESBIAS are always ready, even during a HOLD operation, the circuit can be instantly used upon wakeup from standby or entry into an operation that utilizes a highly accurate reference current. It should be understood that capacitors C1 and C2 are depicted in the Figures using dashed lines because both C1 and C2 are distributed capacitances instead of being lumped-value capacitances. It should also be understood that in an alternative exemplary embodiment, at least a portion of capacitor C1 and/or C2 could comprise a lumped-value capacitance.

Figure 2:
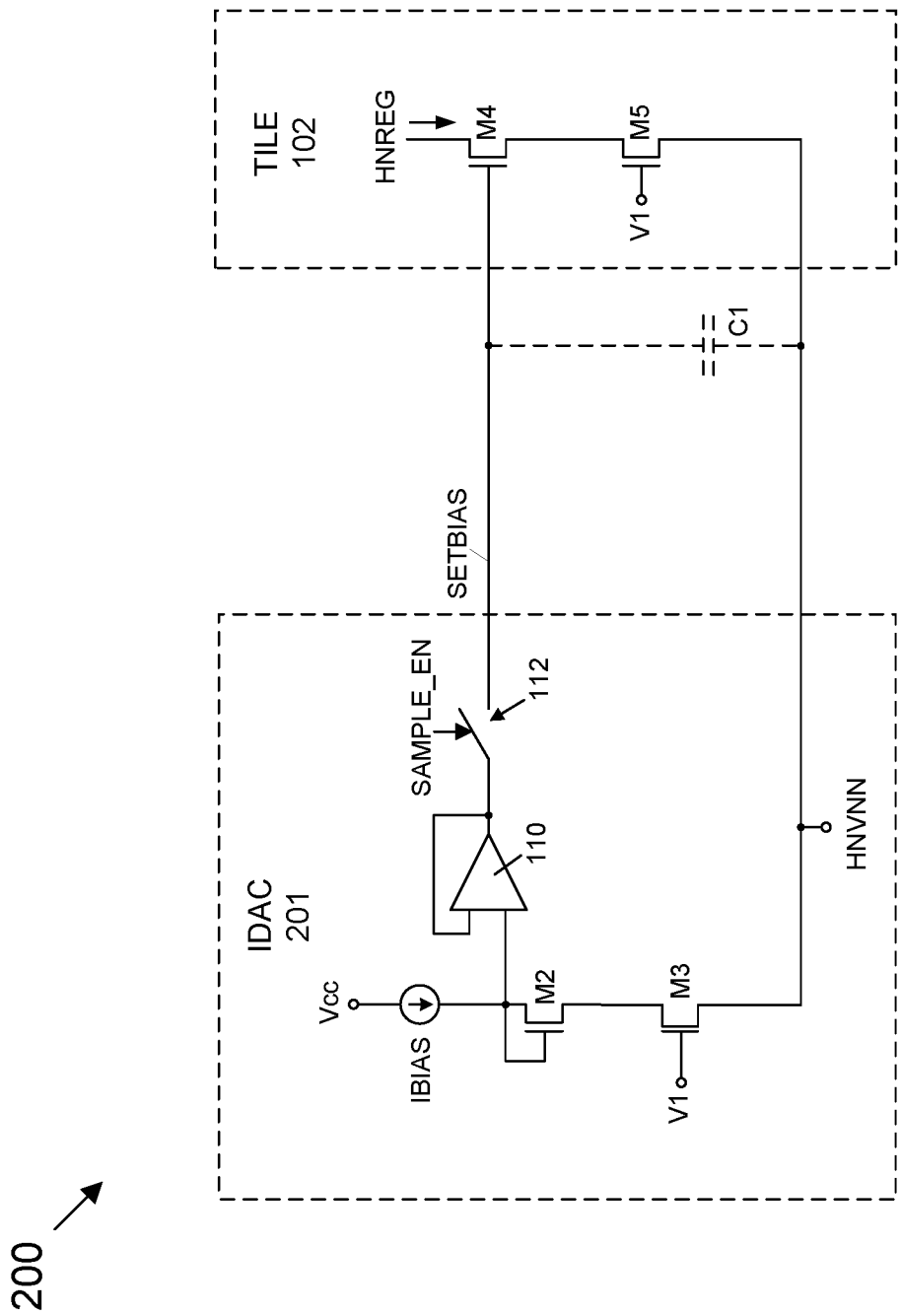
FIG. 2 depicts a schematic diagram of a second exemplary embodiment of a highly distributed current reference according to the subject matter disclosed herein.

FIG. 2 depicts a schematic diagram of a second exemplary embodiment of a highly distributed current reference 200 according to the subject matter disclosed herein. The circuit configuration of highly distributed current reference 200 is similar to highly distributed current reference 100 (FIG. 1) except that active device M3 of IDAC 201 is coupled to a supply voltage V1 and no RESBIAS signal line is used. Supply voltage V1 can be an available supply voltage. Another difference between IDAC 201 and IDAC 101 (FIG. 1) is that IBIAS/N and active device M1 are not needed for IDAC 201. Signal line SETBIAS for distributed current reference 200 is distributed around an integrated circuit to a plurality of TILE current references 102, of which only one is shown in FIG. 2. Tile current references 102 are configured similar to the tile current references depicted in FIG. 1.

Figure 3:
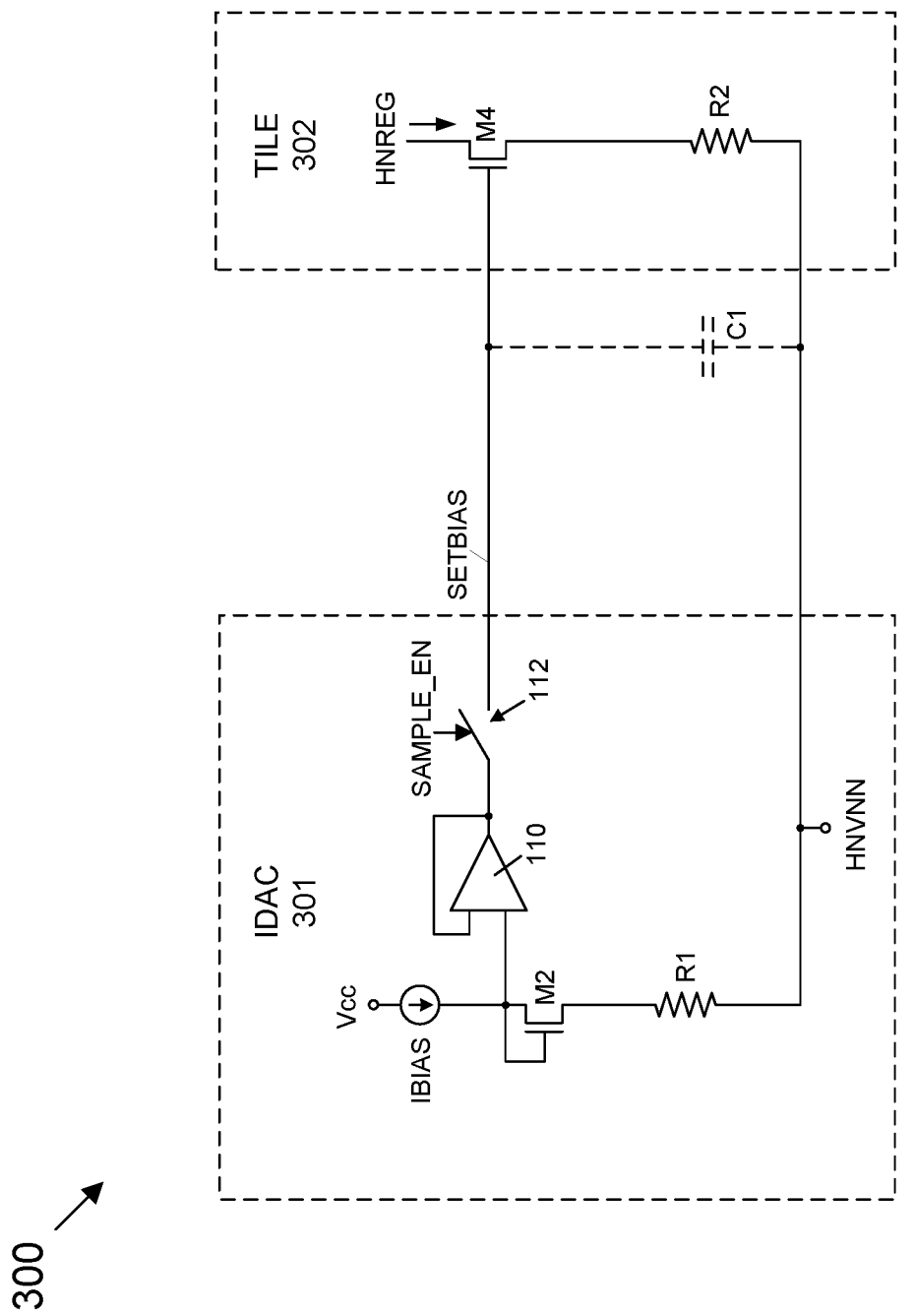
FIG. 3 depicts a schematic diagram of a third exemplary embodiment of a highly distributed current reference according to the subject matter disclosed herein.

FIG. 3 depicts a schematic diagram of a third exemplary embodiment of a highly distributed current reference 300 according to the subject matter disclosed herein. The circuit configuration of highly distributed current reference 300 is similar to highly distributed current reference 200 (FIG. 2) except that device M3 of IDAC 301 is embodied as a resistance R1 instead of an active device. Additionally, a TILE current reference 302 is similar to TILE current reference 102 except active device M5 is embodied as a resistance R2 having a resistance value equal to or about equal to the resistance value of resistance R1.

As yet another alternative exemplary embodiment, active devices M3 and M5 in FIG. 1 could each be replaced with a degenerative resistance. It should be understood that devices M3 and M5 for any of the exemplary embodiments disclosed herein could be metal oxide semiconductor (MOS) devices, resistances, or a combination thereof.

Figure 4:
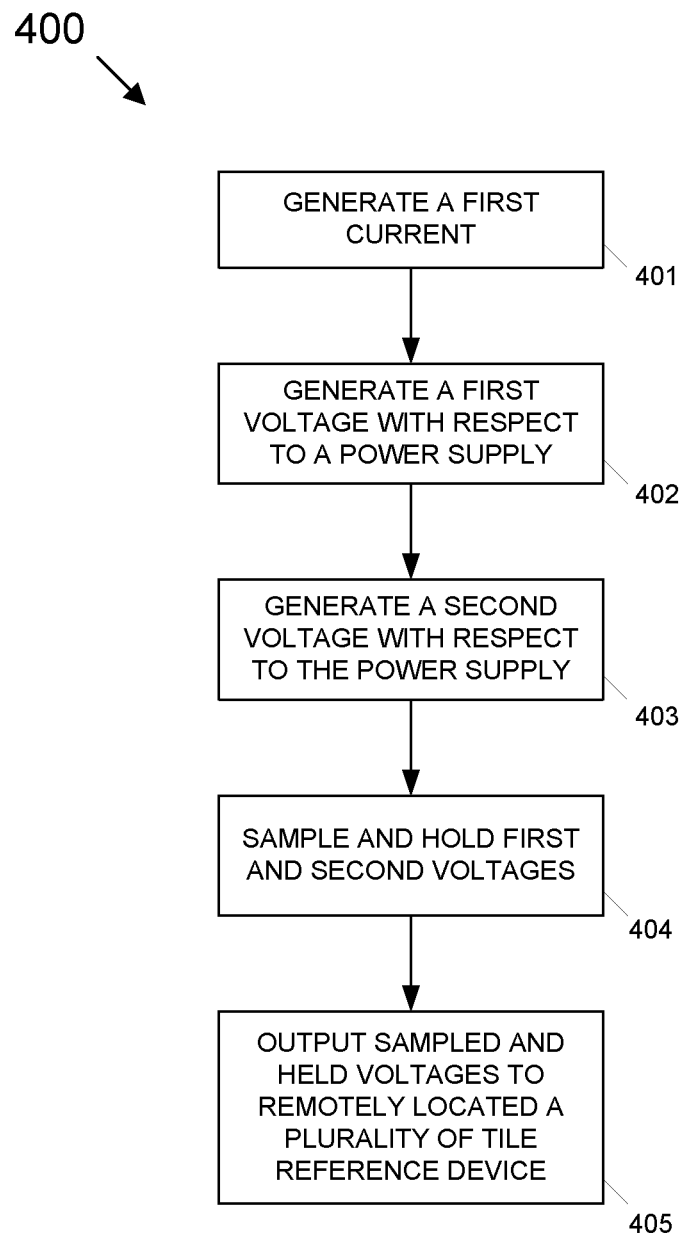
FIG. 4 depicts an exemplary embodiment of a process 400 for generating a reference current according to the subject matter disclosed herein.

FIG. 4 depicts an exemplary embodiment of a process 400 for generating a reference current according to the subject matter disclosed herein. At 401, a first current is generated, such as IBIAS in FIG. 1. At 402, based on the first current, a first voltage signal is generated based with respect to a first power supply. For example, the first voltage signal in some exemplary embodiments may correspond to the voltage at the output from buffer 110 in FIG. 1, which is generated with respect to power supply HNVNN. At 403, based on the first current, a second voltage is generated with respect to the first power supply. For example, the second voltage signal is some exemplary embodiments may correspond to the voltage at the output of buffer 111 in FIG. 1, which is generated with respect to power supply HNVNN. At 404, the first and second voltages are respectively sampled and held. At 405, the held first and second voltages are output to a plurality of remotely located tile current device, such as a tile current 102 in FIG. 1. In one exemplary embodiment of the subject matter disclosed herein, the first voltage signal and the second voltage signal are generated using a degeneration-resistance device, which could comprise a metal oxide semiconductor (MOS) device or a resistance.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

We claim:

1. A current reference source, comprising:
   a first current source to generate a first current, the first current source including a first terminal and a second terminal, the first terminal capable to be coupled to a first power supply voltage; and
   a converter to generate a first voltage signal based on a magnitude of the first current, the converter including:
      a first active device including a first terminal, a second terminal and a third terminal, the first terminal coupled with the second terminal of the first active device and coupled with the second terminal of the first current source;
      a first resistance device including a first terminal and a second terminal, the first terminal of the first resistance device coupled with the first active device, and the second terminal of the first resistance device capable to be coupled to a second power supply voltage; and
      a first buffer including an input and an output, the input of the first buffer coupled with the first active device, the first voltage signal to be output via the output of the first buffer.

2. The current reference source according to claim 1, wherein the first resistance device comprises a second active device.

3. The current reference source according to claim 2, wherein the first and second active devices comprise metal oxide (MOS) semiconductor devices.

4. The current reference source according to claim 1, wherein the first resistance device comprises a second active device or a resistor.

5. The current reference source according to claim 1, where in the first resistance device comprises a first degeneration-resistance device.

6. The current reference source according to claim 1, further comprising at least one tile reference current generator coupled to receive the first voltage signal, the at least one tile reference current generator remotely located from the current reference source.

7. The current reference source according to claim 6, the at least one tile reference current generator comprising:
   a second active device including a first terminal, a second terminal and a third terminal, the first terminal of the second active device to receive the first voltage signal from the output of the first buffer, and the second terminal of the second active device coupled with a node of the at least one tile reference current generator, and
   a second resistance device including a first terminal and a second terminal, the first terminal of the second resistance device coupled with the second active device, and the second terminal of the second resistance device capable to be coupled to the second power supply voltage.

8. The current reference source according to claim 7, further comprising:
   the at least one tile reference current generator included in a non-volatile type of memory;
   the first voltage signal from the output of the first buffer is based on a magnitude of the first current source; and
   the first voltage signal capable to provide a reference current to the at least one tile reference current generator for a memory operation to a portion of the non-volatile type of memory that includes the at least one tile reference current generator.

9. The current reference source according to claim 7, the node of the at least one tile reference current generator comprises an HNREG node.

10. The current reference source according to claim 1, further comprising:
   a second current source to generate a second current, the second current source including a first terminal and a second terminal, the first terminal of the second current source capable to be coupled to the first power supply; and
   the converter to generate a second voltage signal based on a magnitude of the second current, the converter further including:
      a second active device including a first terminal, a second terminal and a third terminal, the first terminal of the second active device coupled with the second terminal of the second active device and coupled with the second terminal of the second current source;

the first resistance device including a third terminal coupled with the first and second terminals of the second active device; and a second buffer including an input and an output, the input of the second buffer coupled with the second active device, the second voltage signal to be output via the output of the first buffer.

11. The current reference source according to claim 10, the converter further including:

a first switch including a signal input, a signal output and a control input, the signal input of the first switch coupled with the output of the first buffer; and a second switch including a signal input, a signal output and a control input, the signal input of the second switch coupled with the output of the second buffer, the control inputs of the first and second switches coupled with a control signal, and the first and second switches are responsive to the control signal to respectively sample and hold the outputs of the first and second buffers.

12. The current reference source according to claim 11, further comprising at least one tile reference current generator coupled with the output of the first switch and the output of the second switch, the at least one tile reference current generator being remotely located from the current reference source.

13. The current reference source according to claim 12, further comprising:

the at least one tile reference current generator included in a non-volatile type of memory;

the signal output of the first switch capable to output the first voltage signal to the at least one tile reference current generator, the first voltage signal is based on a magnitude of the first current source;

the signal output of the second switch capable to output the second voltage signal to the at least one tile reference current generator, the second voltage signal is based on a magnitude of the second current source; and the first and second voltage signals capable to provide respective first and second reference currents to the at least one tile reference current generator for a memory operation to a portion of the non-volatile type of memory including the at least one tile reference current generator.

14. A tile reference current generator included in a non-volatile type of memory, comprising:

a first active device including a first terminal, a second terminal and a third terminal, the first terminal coupled with a first signal line, and the second terminal being coupled to a node of the tile reference current generator; and a first resistance device including a first terminal and a second terminal, the first terminal of the first resistance device coupled with the first active device, and the second terminal of the first resistance device capable to be coupled to a first power supply voltage, a current flowing between the second terminal and the third terminal of the first active device is based on a first voltage signal, and the first voltage signal is based on a magnitude of a first reference current generated by a current reference source that is remotely located from the tile reference current generator, the first reference current for use in a memory operation to a portion of the non-volatile type of memory.

15. The tile reference current generator according to claim 14, the node comprises an HNREG node.

16. The tile reference current generator according to claim 14, the first resistance device comprises a second active device.

17. The tile reference current generator according to claim 16, the first and second active devices comprise metal oxide (MOS) semiconductor devices.

18. The tile reference current generator according to claim 14, wherein the tile reference current generator comprises part of a solid-state drive.

19. The tile reference current generator according to claim 14, the current reference source comprising:

a first current source to generate the first reference current, the first current source including a first terminal and a second terminal, the first terminal capable to be coupled to a second power supply voltage; and a converter to generate the first voltage signal based on the magnitude of the first reference current, the converter comprising:

a second active device including a first terminal, a second terminal and a third terminal, the first terminal coupled with the second terminal of the second active device and coupled with the second terminal of the first current source;

a second resistance device including a first terminal and a second terminal, the first terminal of the second resistance device coupled with the second active device, and the second terminal of the second resistance device capable to be coupled to the first power supply voltage; and a first buffer including an input and an output, the input of the first buffer coupled with the second active device, the first voltage signal to be output via the output of the first buffer.

20. The tile reference current generator according to claim 19, the second resistance device comprises a third active device.

21. The tile reference current generator according to claim 20, the second and third active devices comprise metal oxide (MOS) semiconductor devices.

22. The tile reference current generator according to claim 19, the first and second resistance devices comprising first and second degeneration-resistance devices.

23. The tile reference current generator according to claim 19, the first and second resistance devices comprising first and second resistors.

24. The current reference source according to claim 19, the current reference source further comprising:

a second current source to generate a second reference current, the second current source including a first terminal and a second terminal, the first terminal capable to be coupled to the second power supply; and the converter to generate a second voltage signal based on a magnitude of the second reference current, the converter further including:

a third active device including a first terminal, a second terminal and a third terminal, the first terminal coupled with the second terminal and coupled with the second terminal of the second current source;

the second resistance device including a third terminal coupled with the first and second terminals of the third active device; and a second buffer including an input and an output, the input of the second buffer coupled with the third active device, the second voltage signal to be output via the output of the second buffer.

25. The tile reference current generator according to claim 24, the converter of the current reference source further including:
- a first switch including a signal input, a signal output and a control input, the signal input of the first switch coupled with the output of the first buffer, the output of the first switch being coupled with the first signal line; and
- a second switch including a signal input, a signal output and a control input, the signal input of the second switch coupled with the output of the second buffer, the signal output of the second switch coupled with the second signal line,
- the control inputs of the first and second switches coupled with a control signal, the first and second switches responsive to the control signal to respectively sample and hold the outputs of the first and second buffers.

26. The tile reference current generator according to claim 24, comprising
- the first and second reference currents for use in the memory operation to the portion of the non-volatile type of memory.

\* \* \* \* \*